US010741235B2

(12) United States Patent
Nakamura et al.

(10) Patent No.: US 10,741,235 B2
(45) Date of Patent: Aug. 11, 2020

(54) REFRESH ADDRESS CONTROLLING SCHEME BASED ON REFRESH COUNTER AND MASK CIRCUIT

(71) Applicant: MICRON TECHNOLOGY, INC., Boise, ID (US)

(72) Inventors: Takaaki Nakamura, Saga (JP); Kazuya Saso, Saga (JP)

(73) Assignee: Micron Technology, Inc., Boise, ID (US)

( * ) Notice: Subject to any disclaimer, the term of this patent is extended or adjusted under 35 U.S.C. 154(b) by 1 day.

(21) Appl. No.: 15/436,249

(22) Filed: Feb. 17, 2017

(65) Prior Publication Data

US 2017/0162253 A1 Jun. 8, 2017

Related U.S. Application Data

(62) Division of application No. 14/675,149, filed on Mar. 31, 2015, now Pat. No. 9,607,677.

(51) Int. Cl.
*G11C 11/406* (2006.01)
*G11C 11/408* (2006.01)

(52) U.S. Cl.
CPC ...... *G11C 11/40615* (2013.01); *G11C 11/406* (2013.01); *G11C 11/4087* (2013.01); *G11C 11/40622* (2013.01)

(58) Field of Classification Search
CPC .......... G11C 11/40615; G11C 11/4087; G11C 11/406; G11C 11/40622
See application file for complete search history.

(56) References Cited

U.S. PATENT DOCUMENTS

| 5,515,331 | A | * | 5/1996 | Kim | ...................... G11C 11/406 365/222 |
|---|---|---|---|---|---|
| 7,388,799 | B2 | | 6/2008 | An | |
| 8,254,197 | B2 | | 8/2012 | Tashiiro et al. | |
| 8,264,904 | B2 | | 9/2012 | Kim et al. | |
| 8,363,496 | B2 | | 1/2013 | Hayashi et al. | |
| 8,503,262 | B2 | | 8/2013 | Fujishiro et al. | |
| 8,559,259 | B2 | | 10/2013 | Schreck et al. | |
| 8,630,141 | B2 | | 1/2014 | Tamlyn | |
| 8,767,497 | B2 | | 7/2014 | Marumoto et al. | |
| 9,607,677 | B2 | * | 3/2017 | Nakamura | ............ G11C 11/406 |
| 2006/0002221 | A1 | * | 1/2006 | Hashimoto | ........... G11C 11/406 365/222 |

(Continued)

OTHER PUBLICATIONS

Blog and tutorial downloaded from https://www.perlmonks.org/?node_id=919027, Aug. 7, 2011.*

*Primary Examiner* — Mushfique Siddique
(74) *Attorney, Agent, or Firm* — Dorsey & Whitney LLP

(57) ABSTRACT

An apparatus is disclosed. The apparatus includes an address counter configured to provide a refresh address to a refresh circuit, wherein the address counter includes a plurality of counter cells coupled in series from a first counter cell to a last counter cell downstream of the first counter cell, wherein an output of each of the plurality of counter cells each correspond to an address bit of the refresh address, wherein the address bit of the refresh address provided by a later counter cell downstream of an earlier counter cell is a less significant bit of the refresh address than the address bit of the refresh address provided by the earlier counter cell.

9 Claims, 13 Drawing Sheets

(56) References Cited

U.S. PATENT DOCUMENTS

| | | | | |
|---|---|---|---|---|
| 2007/0242546 | A1* | 10/2007 | Koshikawa | G11C 11/406 365/222 |
| 2008/0137469 | A1* | 6/2008 | Kim | G11C 8/08 365/230.06 |
| 2008/0212386 | A1* | 9/2008 | Riho | G11C 8/12 365/222 |
| 2008/0298153 | A1* | 12/2008 | Mae | G11C 11/406 365/222 |
| 2008/0298154 | A1* | 12/2008 | Mae | G11C 11/406 365/222 |
| 2010/0110817 | A1* | 5/2010 | Noda | G11C 8/18 365/222 |
| 2011/0107005 | A1* | 5/2011 | Nakaoka | G06F 12/0207 711/5 |
| 2012/0026813 | A1* | 2/2012 | Sato | G11C 11/406 365/194 |
| 2012/0307582 | A1* | 12/2012 | Marumoto | G11C 11/40615 365/222 |
| 2014/0003113 | A1 | 1/2014 | Seno et al. | |
| 2016/0293242 | A1 | 10/2016 | Nakamura et al. | |

* cited by examiner

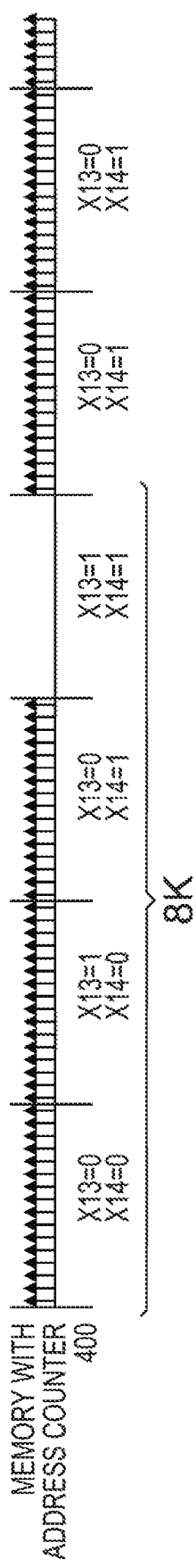
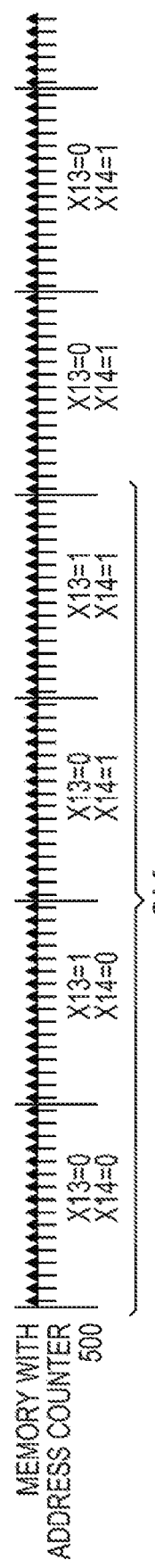
Fig. 6A
Fig. 6B

REFRESH ADDRESS CONTROLLING SCHEME BASED ON REFRESH COUNTER AND MASK CIRCUIT

CROSS-REFERENCE TO RELATED APPLICATIONS

This application is a divisional of U.S. patent application Ser. No. 14/675,149, filed Mar. 31, 2015, issued as U.S. Pat. No. 9,607,677 on Mar. 28, 2017. This application and patent is incorporated by reference herein in its entirety and for all purposes.

BACKGROUND

Some semiconductor memories (e.g., dynamic random access memory (DRAM)) may require periodic refresh operations to maintain data stored therein. A memory device typically sequentially refreshes portions of a memory. A portion of memory may include a word line, a plurality of word lines, a memory array, a plurality of arrays, and/or another sub-set of the memory. The portions of the memory may be associated with refresh addresses. A refresh address counter included in the memory may be used to generate internal refresh addresses in turn to ensure all portions of the memory are refreshed, for example, during self-refresh. The refresh address counter may be a binary counter, and the number of refresh addresses generated by the refresh address counter may be an Nth power of 2.

Some memories may have memory configurations such that the number of portions to be assigned a refresh address is not an Nth power of 2. In memory devices including these memories, the binary address counter may produce refresh addresses to which no portion of the memory is assigned. This may cause wasteful time gaps in the refresh operations in the memory device and/or poor distribution of current in the memory device.

SUMMARY

According to one example, an apparatus is disclosed. The apparatus includes an address counter configured to provide refresh addresses to a refresh circuit, wherein the address counter includes a plurality of counter cells configured to count through count values between a minimum count value to a maximum count value, wherein an output of each of the plurality of counter cells each corresponds to an address hit of the refresh address, and a reset circuit coupled to a counter cell of the plurality of counter cells, wherein the reset circuit is configured to reset the counter cell of the plurality of counter cells to an initial value responsive to the plurality of counter cells changing from a first count value to a second count value to skip at least some of the count values to provide the refresh addresses, wherein the first and second count values are less than the maximum count value.

BRIEF DESCRIPTION OF THE DRAWINGS

FIG. 6A is a timing diagram of refresh operation intervals for a memory.
FIG. 6B is a timing diagram of refresh operation intervals for a memory including the address counter of FIG. 4 according to an embodiment of the disclosure.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
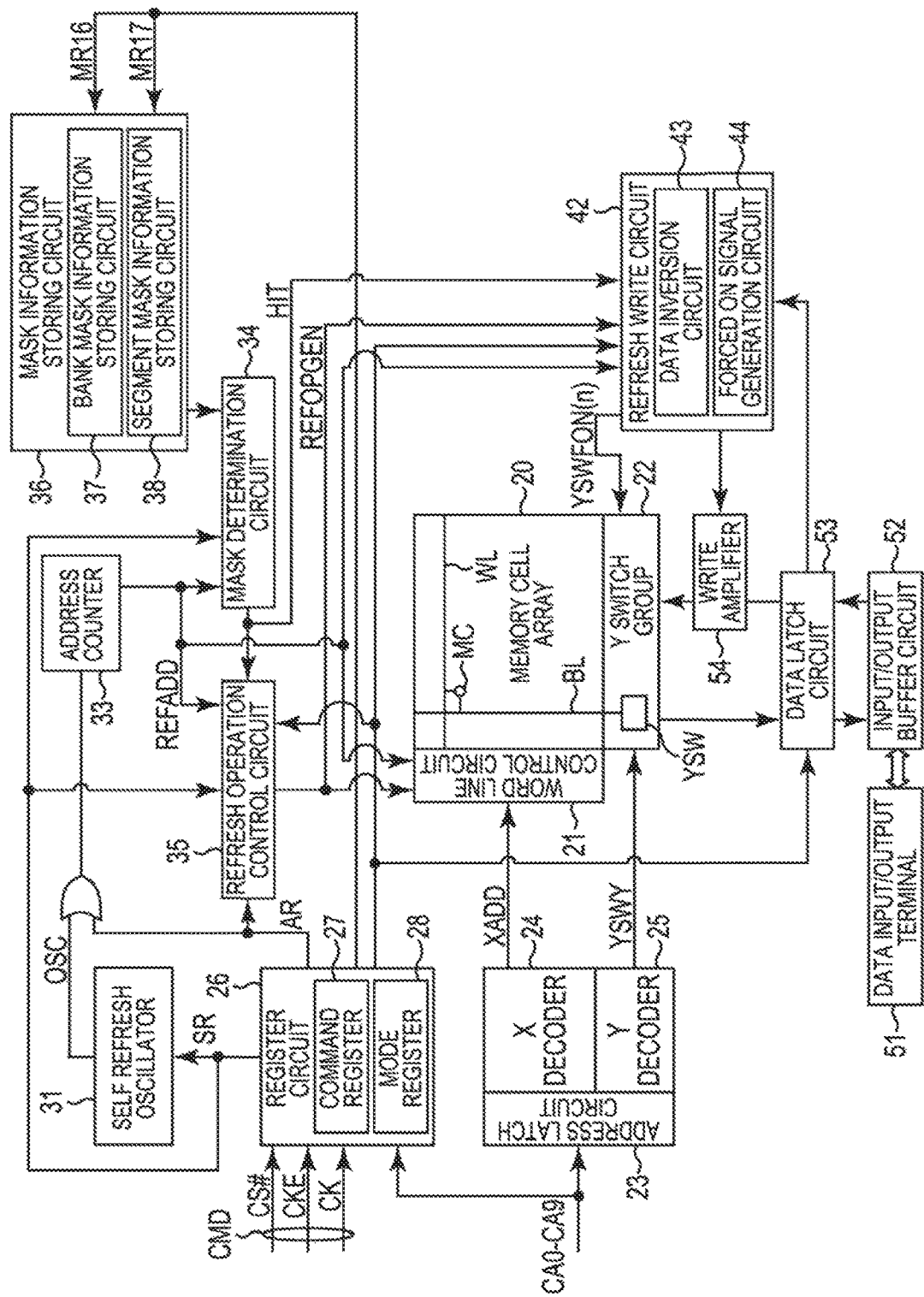
FIG. 1 is a block diagram of a semiconductor memory device according to an embodiment of the disclosure.

FIG. 1 is a block diagram of a semiconductor memory device 10 according to an embodiment of the disclosure. The semiconductor memory device 10 may include a memory cell array 20 that may include a plurality of memory cells MC. The memory cell array 20 may include a plurality of word lines WL and a plurality of bit lines BL arranged intersecting with each other, and each of the memory cells MC may be located at the intersections of the word lines WL and bit lines BL. The memory cell array 20 may be divided into portions, herein referred to as banks, and each bank may be further divided into segments.

Word lines WL included in the memory cell array 20 may be selected by a word line control circuit 21. The selection may be based on a row selection signal Xadd or a refresh address RefADD. Selection of bit lines BL included in the memory cell array 20 may be performed by a column switch group 22. The selection may be based on a column selection signal YSWY or a forced on signal YSWFON(n). The column switch group 22 may include a plurality of column switches YSW coupled to the corresponding bit lines BL.

The row selection signal Xadd and the column selection signal YSWY may be generated based upon command address signals CA0-CA9 which may be supplied from a memory controller (not shown). The command address signals CA0-CA9 may be latched by an address latch circuit 23, and portions corresponding to row addresses may be decoded by an X decoder 24 and outputted as the row selection signal Xadd, while portions corresponding to column addresses may be decoded by a Y decoder 25 and outputted as the column selection signal YSWY.

The command address signals CA0-CA9 may also be provided to a register circuit 26. The register circuit 26, which may include a command register 27 and a mode register 28, may receive the command address signals CA0-CA9 and a command signal CMD, and may generate one or more output signals based upon the provided signals. The command signal CMD may include a clock signal CK, a clock enable signal CKE, and a chip select signal CS #.

The command register 27 may output a self-refresh internal command SR in response to the issue of a self-refresh command. The command register 27 may output an auto-refresh internal command AR in response to an auto-refresh command. The self-refresh internal command SR may be supplied to a self-refresh oscillator 31. When the self-refresh internal command SR is activated, the self-refresh oscillator 31 may automatically generate an internal refresh signal OSC in a periodic manner. The period of generating the internal refresh signal OSC may be set to a period with which information stored in all the memory cells MC included in the memory cell array 20 may be maintained.

The internal refresh signal OSC and the auto-refresh internal command AR may be supplied to an address counter 33 via an OR gate 32. The address counter 33 may be a counter that generates a refresh address RefADD. A counter value of the address counter 33 may be updated in response to the internal refresh signal OSC and/or the auto-refresh internal command AR. The refresh address RefADD may be supplied to a mask determination circuit 34 and a refresh operation control circuit 35.

The mask determination circuit 34 may be activated by the self-refresh internal command SR and may activate a match signal HIT to a high logic level in response to detection of a match between the refresh address RefADD and mask information MASK. The refresh operation control circuit 35 may be activated by the self-refresh internal command SR and/or the auto-refresh internal command AR, and when the match signal HIT is not activated, it may generate a refresh operation signal RefOPGEN. The refresh operation signal RefOPGEN may be supplied to the word line control circuit 21, by which a refresh operation for the specified refresh address RefADD may be performed. When the match signal HIT is activated, the refresh operation control circuit 35 may not generate the refresh operation signal RefOPGEN, and the refresh operation nay be disabled.

The mask information MASK may include information that indicates a bank and/for a segment for which the self-refresh operation is not performed among the banks and/or the segments included in the memory cell array 20. The information may be supplied from a mask information storage circuit 36. The mask information storage circuit 36 may include a bank mask information storage circuit 37 and a segment mask information storage circuit 38. The bank mask information storage circuit 37 may store information indicating one or more banks for which the self-refresh operation is not performed and the segment mask information storage circuit 38 may store information indicating one or more segments for which the self-refresh operation is not performed. With this configuration, it may be possible to specify whether to perform the self-refresh operation for each of the banks and each of the segments of the memory cell array 20. Settings of the mask information MASK in the bank mask information storage circuit 37 and the segment mask information storage circuit 38 may be performed by setting signals MR16 and MR17, respectively. The setting signals MR16 and MR17 may be provided by the mode register 28.

As shown in FIG. 1, the semiconductor memory device 10 may further include an input/output buffer circuit 52, a data latch circuit 53, and write amplifier 54. The input/output buffer circuit 52 may buffer data that is input and output via a data input/output terminal 51. The data latch circuit 53 may latch data that is input and output via the input/output buffer circuit 52. The write amplifier 54 may amplify write data that is latched in the data latch circuit 53. With this configuration, at the time of a read operation, any one of the column switches YSW specified by the column selection signal YSWY may be switched on, by which read data that is read out from the bit line BL selected by the column selection signal YSWY may be output to the data input/output terminal 51 via the data latch circuit 53 and the input/output buffer circuit 52. At the time of a normal write operation, write data input to the data input/output terminal 51 may pass through the input/output buffer circuit 52, the data latch circuit 53, and the write amplifier 54, and may be supplied to the selected bit line BL via any one of the column switches YSW specified by the column selection signal YSWY.

The semiconductor memory device 10 may further include a refresh write circuit 42. The refresh write circuit may include a data inverting circuit 43 and a column switch control circuit 44, by which an operation of inverting the write data and a forced on operation of the column switch YSW may be performed.

Figure 2:
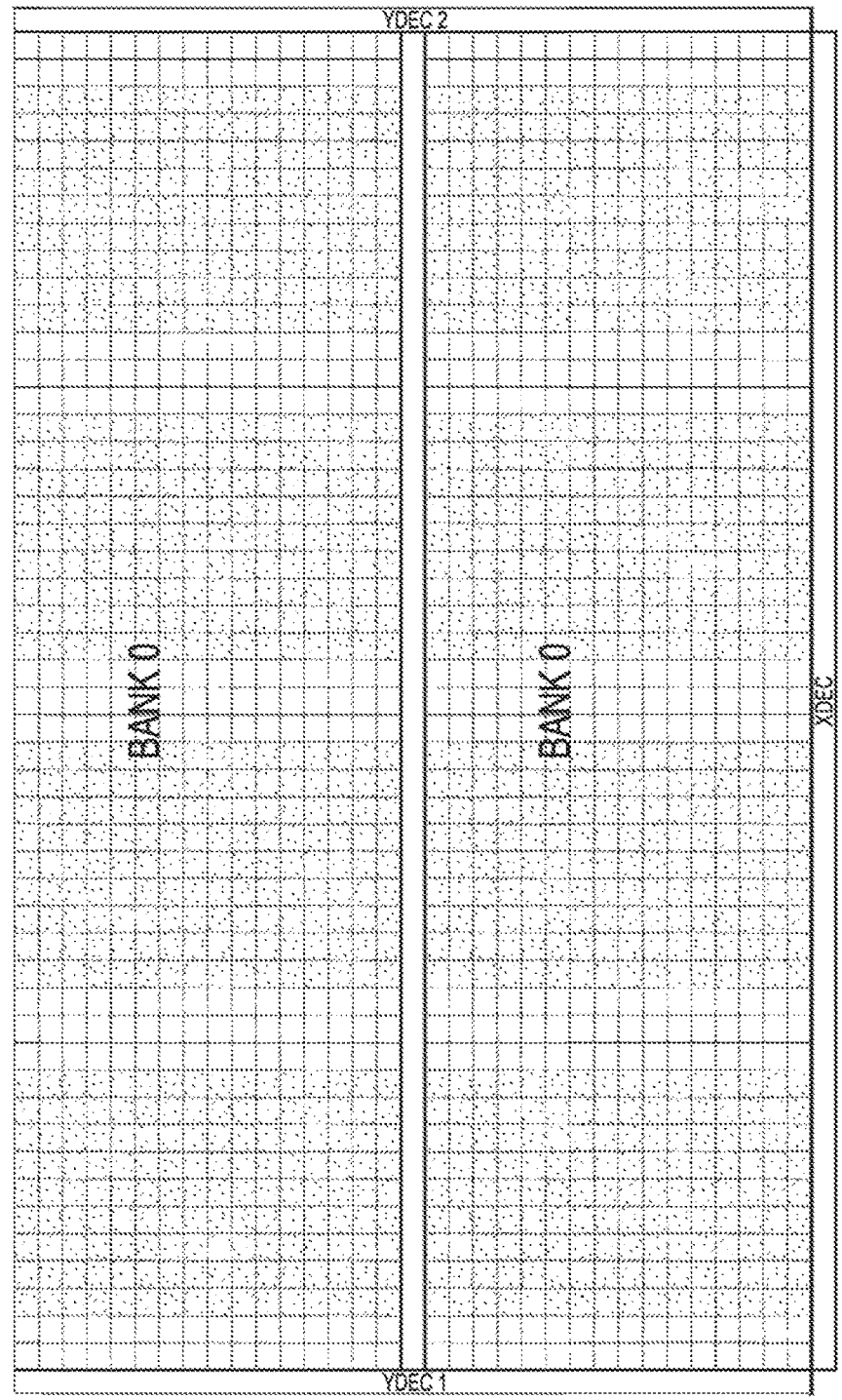
FIG. 2 is a schematic illustration of a memory array.

FIG. 2 is a schematic illustration of a memory array 200. In some embodiments, the memory array 200 may be used to implement the memory cell array 20 of FIG. 1. In some embodiments, the memory array 200 may be divided into eight portions referred to herein as banks. The address configuration of bank 0 is described; however, the same address configuration may be implemented for banks 1-7.

In bank 0, column decoders YDEC1 and YDEC2 may be positioned on two opposing sides of bank 0, and memory mats (e.g. memory blocks) extending from MAT0 on the right-hand end (from the perspective of the reader) to MAT24 in a center portion of bank 0 to MAT48 on the left-hand end. Memory mats MAT(0-48) labels are shown above bank 0 in FIG. 2. The memory mats may be accessible to column decoders YDEC1 and YDEC2. Row decoder XDEC may be positioned adjacent to bank 0 in the row direction. Memory mats are described in detail in Japanese publication JP-A No. 2014-010845, published on Jan. 20, 2014, and U.S. publication No. 2014/0003113, published on Jan. 3, 2014, which are incorporated herein by reference for any purpose. The number of memory mats in the X-address direction of bank 0 corresponds to 48 memory mats. Six, bits (X9-14) of mat addresses may be used as the X-address, which means 64 ($6^{th}$ power of 2) memory mats may be selected even though only 48 memory mats are included in bank 0. As a result, when both mat address bits X13 and X14 correspond to 1, no memory mat included in bank 0 is selected. That is, when both mat address bits X13 and X14 correspond to 1, the X-address corresponds to memory mats 49-63, which are not included in bank 0. In the Y-address direction, 32 ($5^{th}$ power of 2) memory mats may be included.

Figure 4:
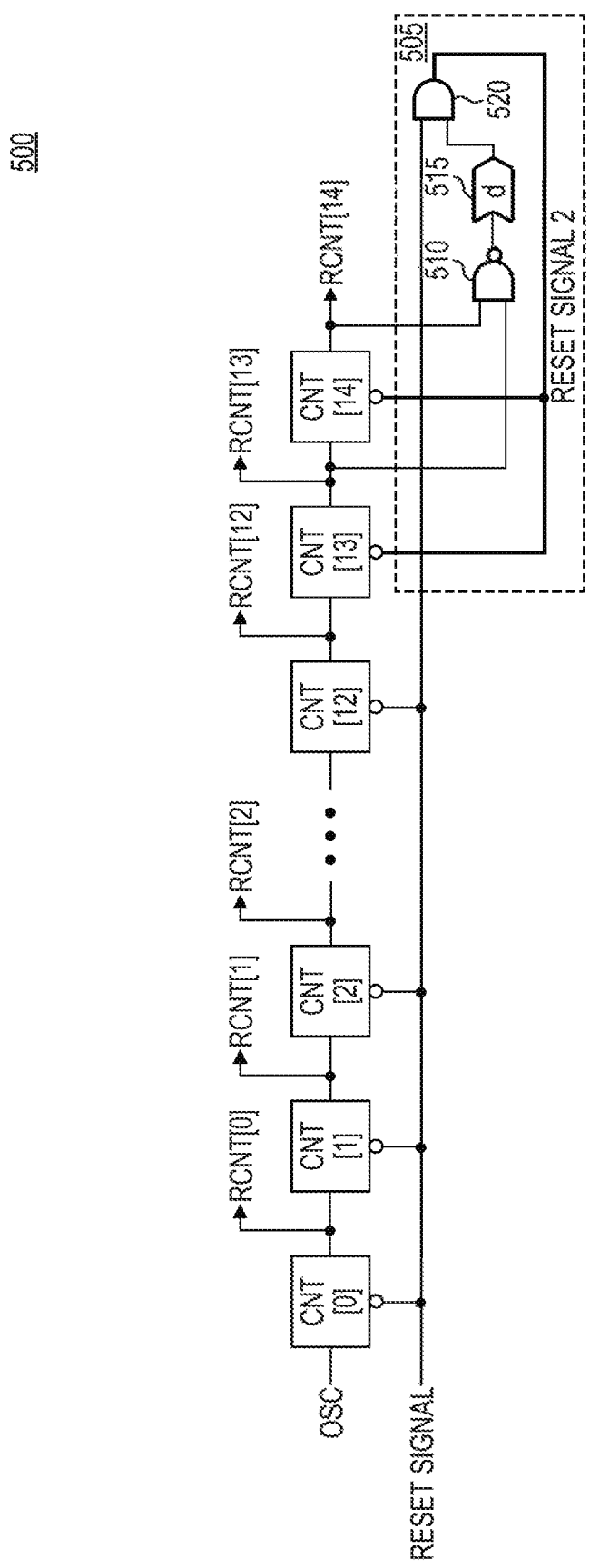
FIG. 4 is a schematic illustration of an address counter according to an embodiment of the disclosure.

FIG. 4 is a schematic illustration of an address counter 500 according to an embodiment of the disclosure. The address counter 500 may be used to implement address counter 33 in some embodiments. The address counter 500 includes counter cells CNT[0]-CNT[14]. The counter cells may count through count values from a minimum count value to a maximum count value (e.g., 000, 001 ... 111). The counter cells CNT[0]-CNT[14] may be coupled in series with one another from a first counter cell CNT[0] to a last counter cell CNT[14] downstream of the first counter cell, and their outputs Rcnt[0]-Rcnt[14] may correspond to the address bit numbers X[0-14] of row addresses in a memory bank, such as bank 0 illustrated in FIG. 2. The outputs Rcnt[0]-Rcnt[14] may be provided to a refresh operation control circuit such as refresh operation control circuit 35 shown in FIG. 1, which may provide the corresponding address to a word line control circuit, such as word line control circuit 21 shown in FIG. 1. A clock signal OSC may be generated by a self-refresh oscillator, such as self-refresh oscillator 31 illustrated in FIG. 1. The clock signal OSC may be provided as the input to CNT[0] rather than an input of Rcnt[i−1].

Figure 3:
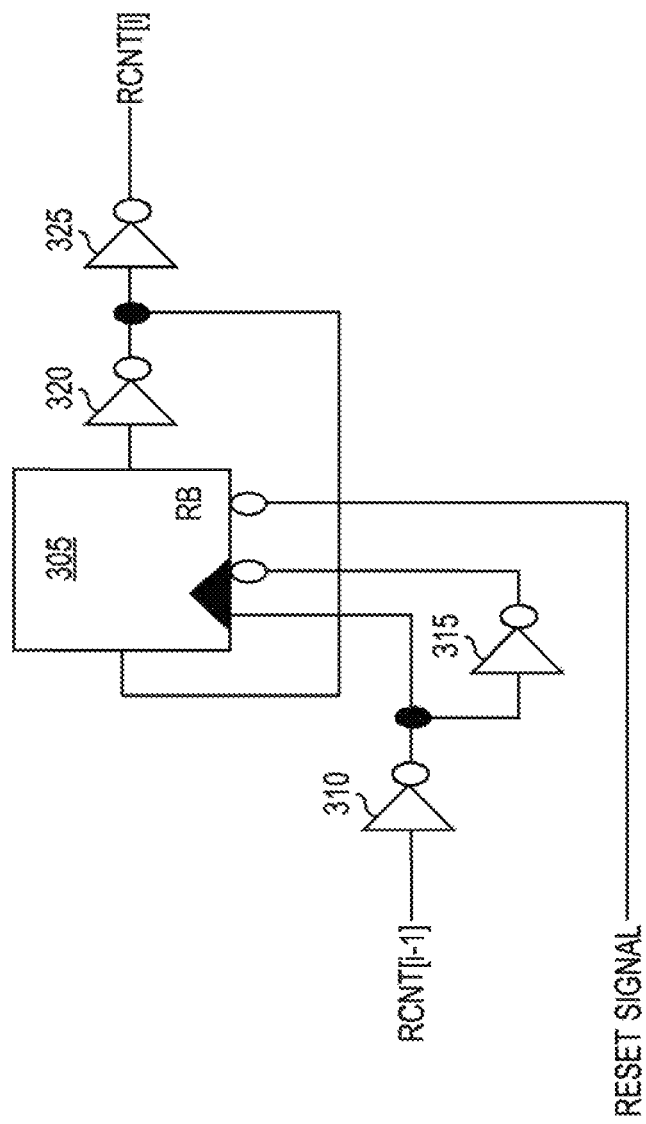
FIG. 3 is a schematic illustration of a counter cell.

FIG. 3 is a schematic illustration of a counter cell 300 according to an embodiment of the invention, which may be used to implement a counter cell CNT of the address counter 500 in some embodiments. The counter cell 300 may include a flip-flop 305 of a master-slave type. The flip-flop 305 may receive a signal Rcnt[i−1] at an input via an inverter 310. The flip-flop 305 may receive the output of the inverter 310 through a second inverter 315 at a second input. The flip-flop 305 may also receive a reset signal at a third input. The flip-flop 305 may provide an output to a third inverter 320. The third inverter 320 may provide the output to a fourth input of the flip-flop 305 and a fourth inverter 325. The fourth inverter 325 may provide an output signal Rcnt[i].

The address counter 500 may be configured such that when the counter cells count to a count value corresponding to both refresh, address bits X13 and X14 set to 1, the counter cells corresponding to the respective address bits are reset before reaching the maximum count value so as to skip the range of address having address bits X13 and X14 as 1. As a result, the address counter 500 may skip one or more count values so that the address counter 500 may not provide addresses that correspond to refresh addresses where both X13 and X14 are set to 1.

The address counter 500 may include a counter logic circuit 505. The counter logic circuit 505 may include a NAND gate 510 configured to receive outputs Rcnt[13] and Rcnt[14] as inputs. The output of NAND gate 510 may be coupled to a delay 515. Delay 515 may be configurable to provide a stable pulse width. The output of delay 515 and the reset signal may be coupled to inputs of AND gate 520. The output of the AND gate 520, RESET SIGNAL 2, may be provided as an input to CNT[13] and CNT[14] rather than the reset signal provided to the counter cells CNT[0-12]. The counter logic circuit 505 may set a reset signal to logic level low (active) when both of the outputs of counter cells CNT[13] and CNT[14], which correspond to X-address bits X13 and X14, respectively, become logic level high (i.e., X13 and X14 are 1). The logic level low reset signal RESET SIGNAL 2 provided to the counter cells CNT[13] and CNT[14] may cause the counter cells to reset such that both counter cells return to logic level low. This may cause the address counter 500 to skip addresses corresponding to refresh addresses where X13 and X14 are set to 1.

Figure 5:
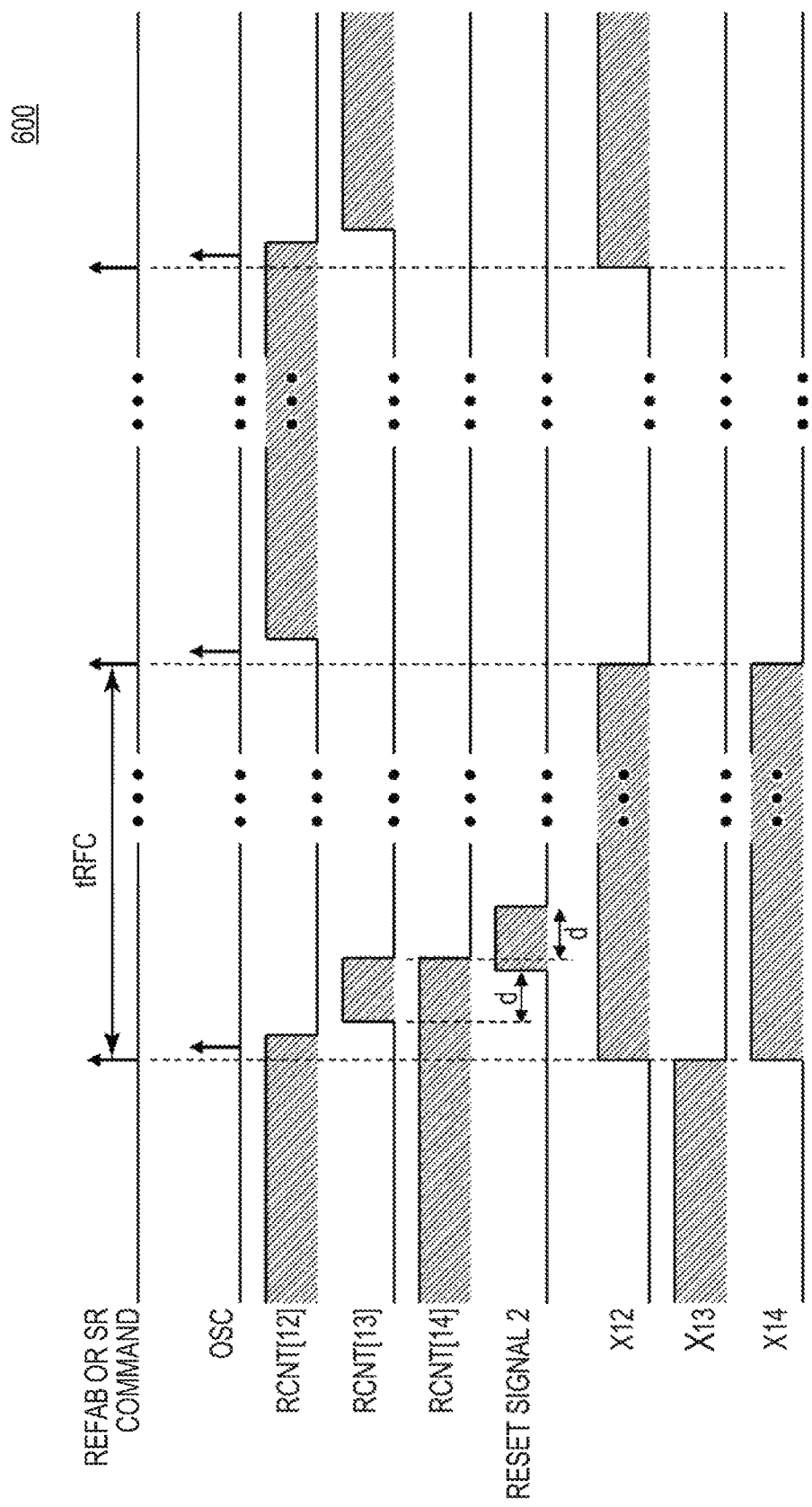
FIG. 5 is a timing diagram of the operation of a memory including an address counter according to an embodiment of disclosure.

FIG. 5 is a timing diagram of the operation of a memory including an address counter according to an embodiment of the disclosure. The memory may be implemented using the semiconductor memory device 10 illustrated in FIG. 1. The address counter 33 may be implemented using address counter 500 illustrated in FIG. 4. In response to receiving a refresh-all bank command REFAB and/or a self-refresh command SR, the command register 27 may provide a logic level low to an input of OR gate 32 in FIG. 1. In response to the logic level low of one of the inputs, the OR gate 32 may supply a clock signal OSC to address counter 33. In response to the clock signal OSC, the counter cells of the address counter 33 may carry out counting operations. For brevity, the counting operations of only counter cells CNT[12-14] providing the three highest order (e.g., most significant) bits X12-X14, as illustrated in FIG. 4, will be described.

The counter logic circuit 505 may generate a reset signal RESET SIGNAL 2 at the time the outputs Rcnt[13] and Rcnt[14] of CNT[13] and CNT[14], respectively, are both logic level high. As shown in FIG. 5, a timing hazard may occur between the Rcnt[13] signal and the output of the counter logic circuit 505 RESET SIGNAL 2. However, the timing hazard may be mitigated by latching signals X13 and X14 by an internal refresh command. The command interval corresponding to tRFC may be maintained at a minimum frequency. As a result, the delay from the additional logic of the counter logic circuit 505 may not cause a timing issue in the memory.

FIG. 6A is a timing diagram of refresh operation intervals for a memory including a conventional 15 bit address counter. FIG. 6B is a timing diagram of refresh operation intervals for a memory including address counter 500 according to, an embodiment of the disclosure, the refresh operation intervals shown in FIG. 6A, during an 8K refresh period, for the period of time where both X13, X14=1, no refresh operation is performed as no corresponding memory mats exist to refresh. During the 8K refresh period, for the period of time where X13, X14=0,0 or 1,0 or 0,1, refresh operation is performed as corresponding memory mats exist to refresh. In contrast, as shown in FIG. 6B, addresses corresponding to X13, X14=1 are skipped and no address count is carried out for the non-existing memory mats. This ma allow for a self-refresh operation having a 6K refresh period although a 15-bit address counter is used. That is, by allowing a REF command that has been conventionally generated at 8K to be generated at 6K, the actual refresh number of times may be increased which may improve reliability. In comparison to the case where a conventional 15-bit address counter is used, the address counter 500 may reduce power consumption because the addresses having X13 and X14 as 1 are skipped, and any internal operations related to refreshing non-existent memory locations can be avoided.

Figure 7:
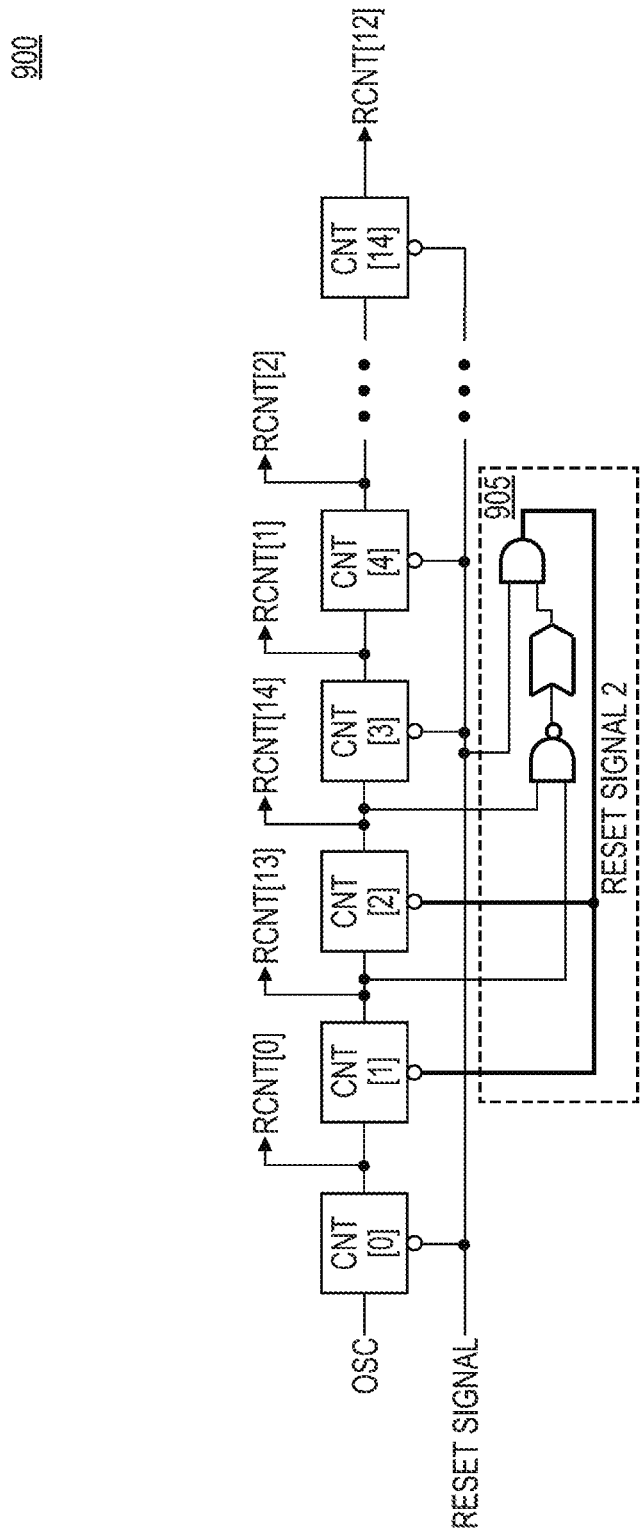
FIG. 7 is a schematic illustration of an example alternative address counter according to an embodiment of the disclosure.

As will be described in more detail below, in some embodiments, the address to be skipped may not be from an upper counter cell, but may be from a lower counter cell so that the output from the corresponding lower cell is sent to Rcnt[13], Rcnt[14]. FIG. 7 is a schematic illustration of an address counter 900 according to an embodiment of the invention. The address counter 900 includes counter cells CNT[0]-CNT[14] and counter logic circuit 905. As shown in FIG. 7, outputs from counter cells CNT[1] and CNT[2] are provided as Rcnt[13] and Rcnt[14], respectively, and may be used as inputs to the counter logic circuit 905.

As illustrated in FIG. 6A, both X13 and X14 equal 1 for 2K of an 8K refresh period. That is, when the address counters are successively refreshed without compensating for the non-existing memory blocks, the refresh operation is not carried out for a consecutive ¼ of the refresh period. The refresh operation is continuously carried out during the remaining consecutive ¾ of the refresh period. Having an uninterrupted 2K period of no refresh operations may not be desirable for averaging refresh currents. However, in some applications, it may not be desirable to decrease the refresh period from 8K to 6K by skipping refresh addresses that correspond to non-existing memory mats.

Alternatively, an address counter may be configured so that the periods of no refresh operations may be distributed over the refresh period of 8K. One or more bits of addresses may be switched, for example, more significant bits and less significant bits of addresses may be transposed in the address counter. That is, the output of one or more counter cells forming the address counter may be switched so that periods in which refresh address bits X13, X14 are both set to 1 are distributed over the refresh period.

Figure 8:
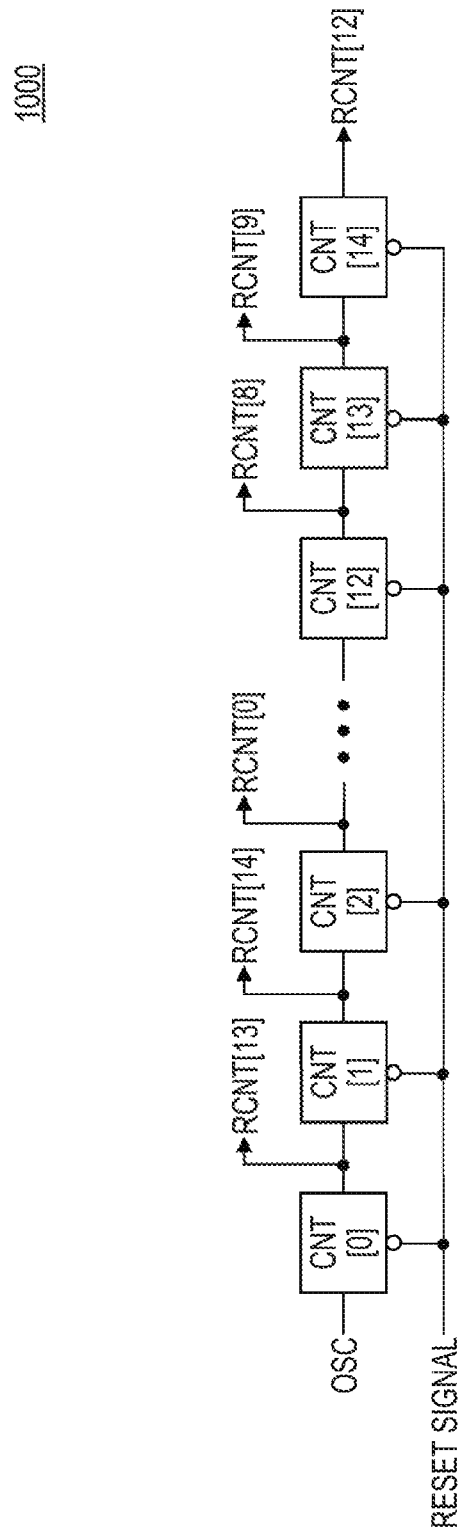
FIG. 8 is a schematic illustration of an alternative address counter according to an embodiment of the disclosure.
Figure 10:
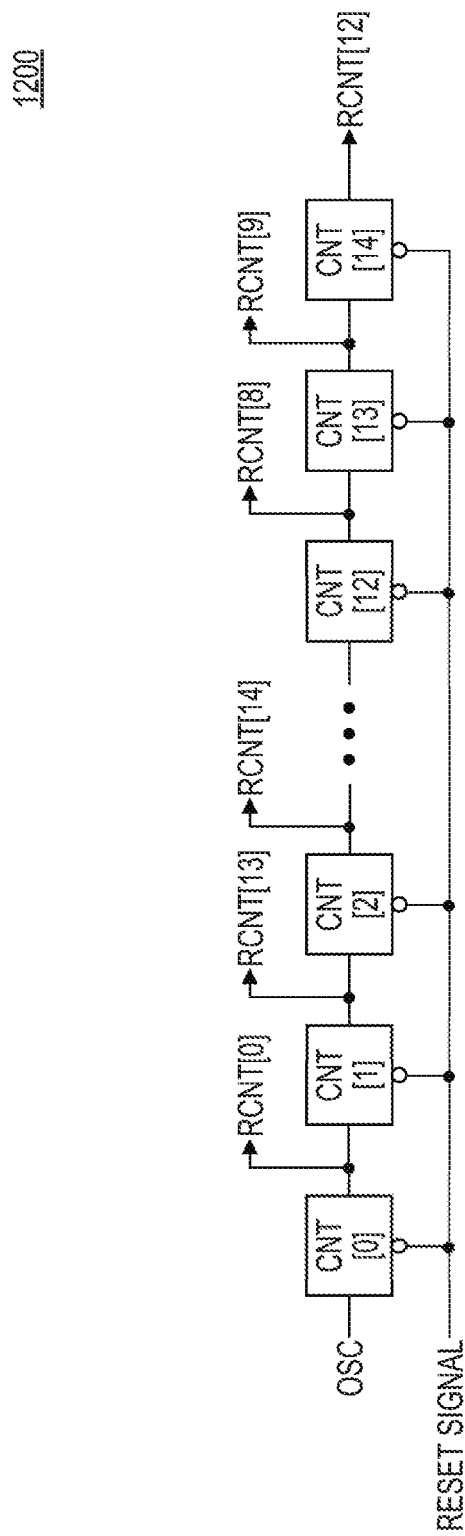
FIG. 10 is a schematic illustration of an alternative address counter according to an embodiment of the disclosure.

FIG. 8 is a schematic illustration of an address counter 1000 according to an embodiment of the disclosure. Address counter 1000 may be used to implement address counter 33 in FIG. 1. The address counter 1000 includes counter cells CNT[0]-CNT[14]. As shown in FIG. 10, the addresses of X13 and X14 may be respectively received from outputs of counter cells other than counter cells CNT[13] and CNT[14]. For example, in the embodiment illustrated in FIG. 10, the addresses X13 and X14 are provided at the outputs of the counter cells CNT[0] and CNT[1]. The rest of the Rcnt[i] is shifted onto the upper counter cells by two bits for the remaining counter cells. Since the alteration is made to the least significant two bits, of the 8K (8192) possible addresses, no refresh operation is carried for 2K (2048) addresses where both of the counter cells CNT[0] and CNT[1] of the lower two bits are set to 1.

Figure 9:
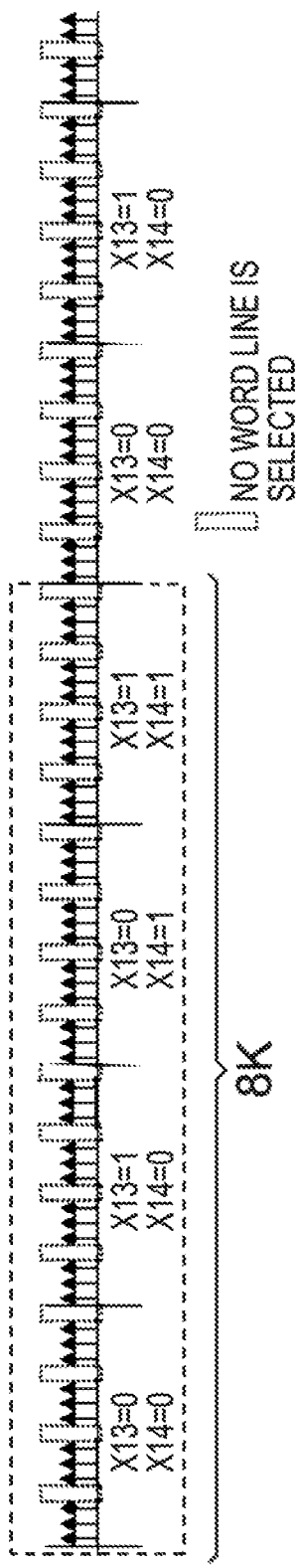
FIG. 9 is a timing diagram of refresh operation intervals for a memory including the address counter of FIG. 8 according to an embodiment of the disclosure.

FIG. 9 is a timing diagram of refresh operation intervals for a memory including address counter 1000 according to an embodiment of the disclosure. As shown, periods during which no refresh operation is carried out (e.g., X13 and X14 are both 1) may be distributed throughout the potential 8K addresses. With this configuration, because the periods when no refresh operation is performed is distributed throughout the total possible addresses, relatively long periods of time where the current consumption deviates (e.g., where X13 and X14 are the two most significant bits) may be avoided, and the average current consumption may be more consistent.

By replacing X13 and X14 with the least significant bits X0 and X1, the effect of current averaging process per unit time may be desirable in some applications. However, other configurations of distributing the addresses corresponding to 2K of no refresh operations throughout the 8K refresh period are possible. For example, FIG. 10 is a schematic illustration of an alternative address counter 1200 according to an embodiment of the disclosure. Address counter 1200 may be used to implement address counter 33 in FIG. 1. The address counter 1200 includes counter cells CNT[0]-CNT[14]. In address counter 1200, the outputs of CNT[1] and CNT[2] are set to Rcnt[13] and Rcnt[14], respectively. In comparison to address counter 1000, each of Rcnt[13] and Rcnt[14] are shifted to a higher-order bit by one.

Figure 11:
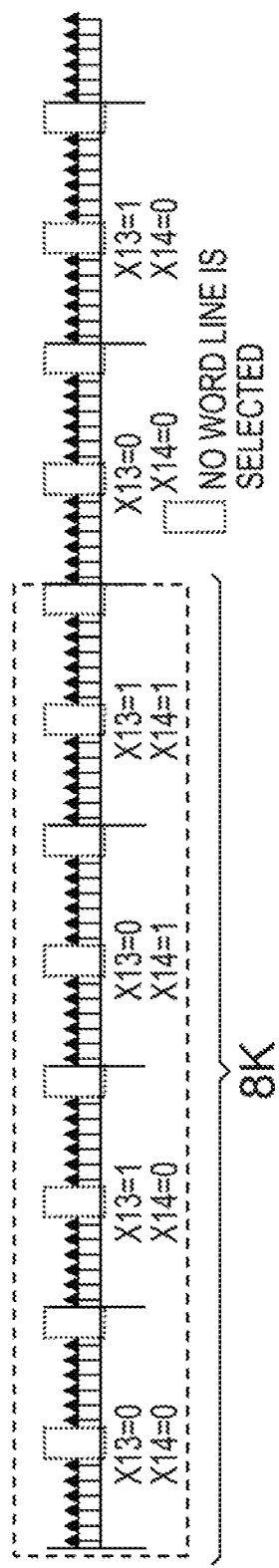
FIG. 11 is a timing diagram of refresh operation intervals for a memory including the address counter of FIG. 10 according to an embodiment of the disclosure.
Figure 12:
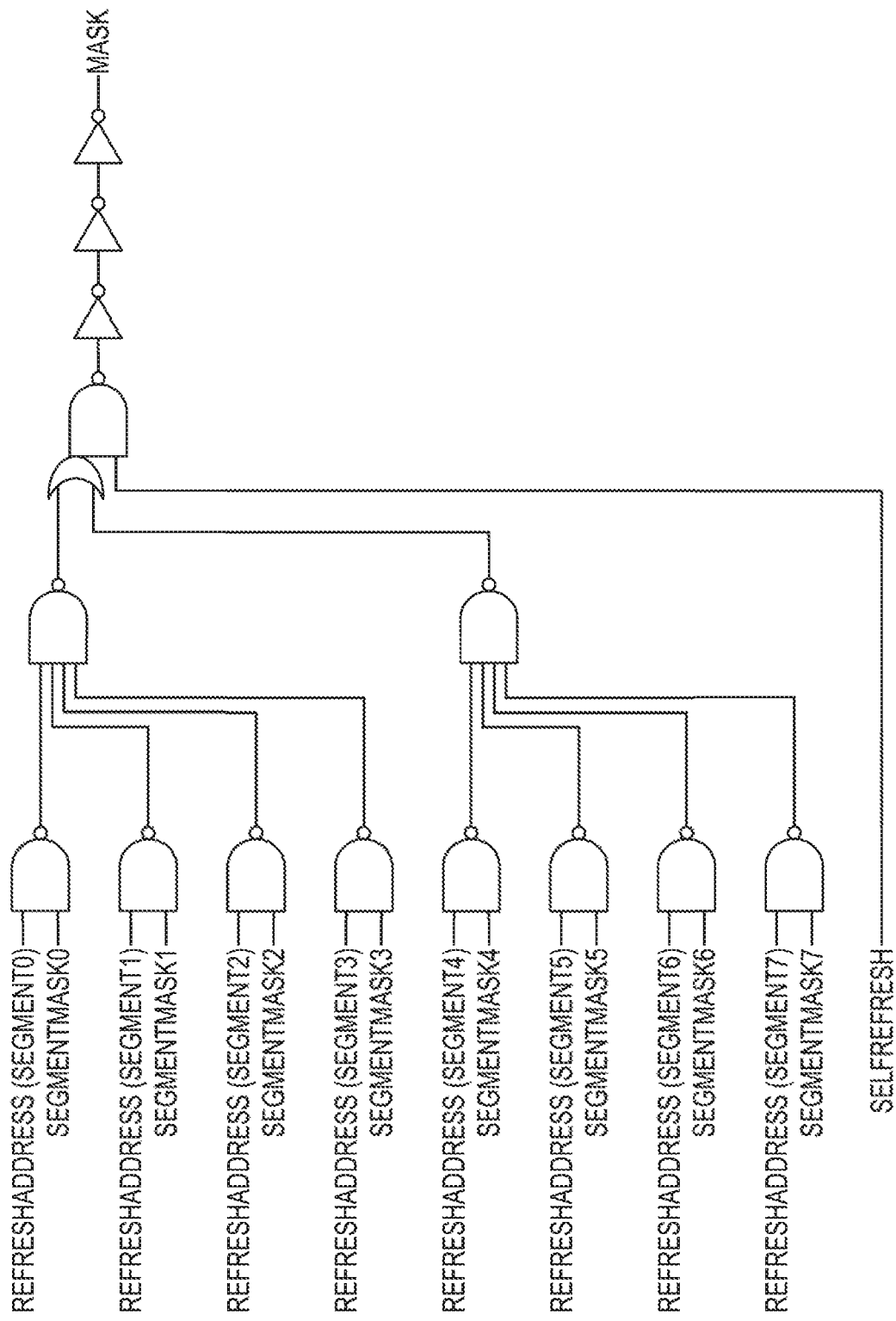
FIG. 12 is a schematic illustration of an example comparison circuit.

FIG. 11 is a timing diagram of refresh operation intervals for a memory including address counter 1200 according to an embodiment of the disclosure. In contrast to address counter 1000, the periods during which no refresh operation occur less frequently and are longer. For example, in comparison to the address counter 1000, the periods of no refresh operation are twice as long and the number of periods of no refresh operations is half for address counter 1200 compared to address counter 1000.

As mentioned previously in reference to FIG. 1, a memory device 10 may include a mask determination circuit 34. The mask determination circuit may include a comparison circuit to compare the address received from the register circuit 26 and the mask information storage circuit 36. FIG.

12 is a schematic illustration of an example comparison circuit 1400. The comparison circuit 1400 may output a MASK signal to suppress a self-refresh operation when the refresh address RefreshAddress(Segment0-7) received matches an address SegmentMask(0-7) stored in the mask information storage circuit 36. A more detailed description of a conventional mask determination circuit and its operation may be found in U.S. Pat. No. 8,363,496, issued on Jan. 29, 2013, which is incorporated herein by reference for any purpose. A mask determination circuit including the comparison circuit 1400 may not have a one-to-one correspondence for a non-Nth power of 2 memory cell array. Additional activation/deactivation logic may need to be added, which may overlap with the existing mask determination circuit. This may require an increase in the chip size.

Figure 13:
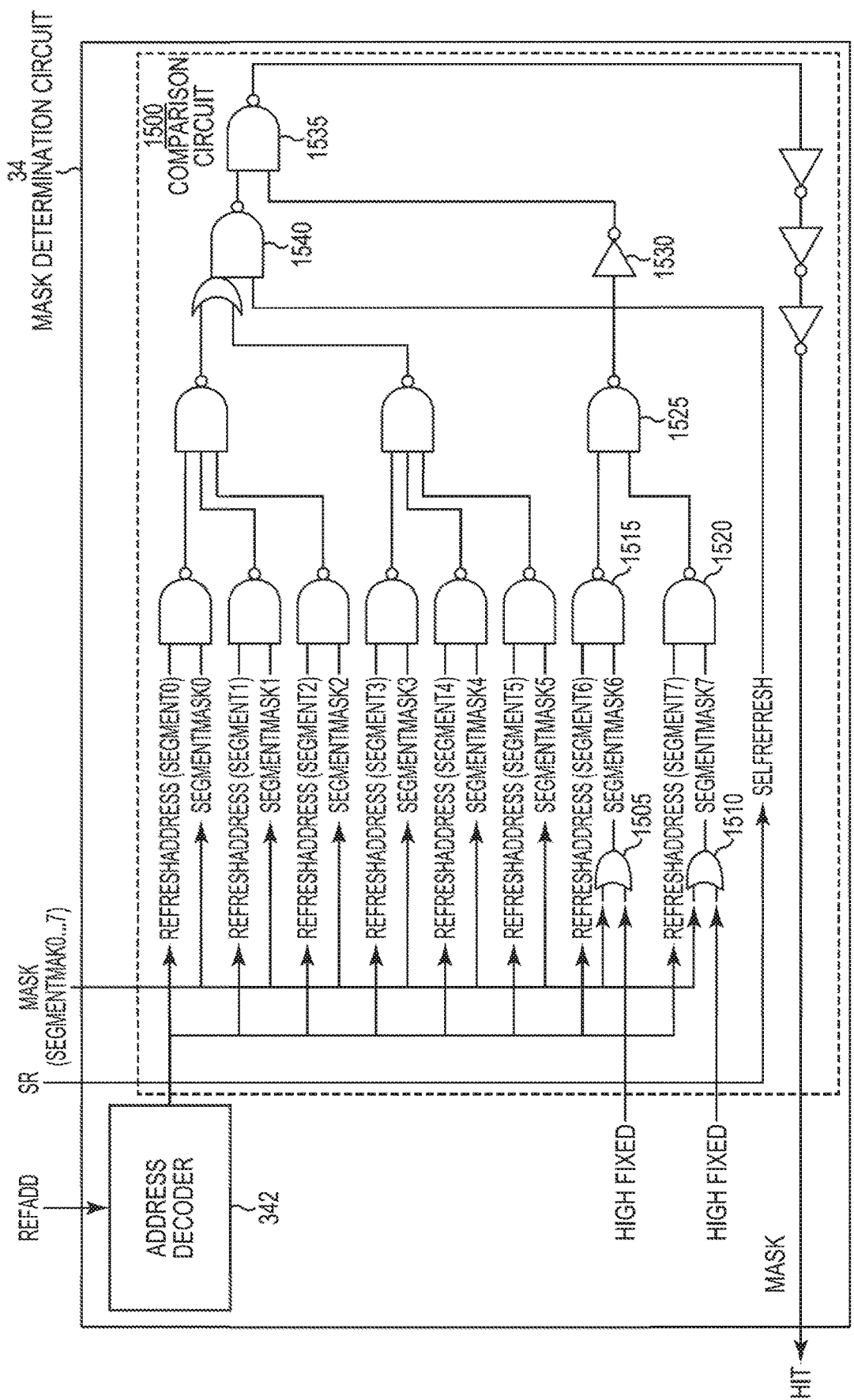
FIG. 13 is a schematic illustration of a mask determination circuit including a comparison circuit according to an embodiment of the disclosure

FIG. 13 is a schematic illustration of mask determination circuit 34 including a comparison circuit 1500 according to an embodiment of the disclosure. The mask determination circuit 34 may be activated by the self-refresh internal command SR, and in response to the detection that a refresh RefADD and mask information MASK match, a match signal HIT may be activated to a high logic level. The mask determination circuit 34 may receive MASK signals SegmentMasks(0-7) from a mask information storage circuit 36. The MASK signals SegmentMasks(0-7) may be provided to the comparison circuit 1500. When segment masks are used, an address decoder 342 may be included for decoding the segment to which a refresh address RefADD corresponds. The address decoder 342 may provide a decoded address to the comparison circuit 1500. The comparison circuit 1500 may compare the decoded address to the MASK signals SegmentMasks(0-7). The MASK signals may include BankMasks(0-7) in addition to SegmentMasks(0-7). For simplicity, the BankMasks(0-7) signals are not shown in FIG. 13.

Still referring to FIG. 13, the comparison circuit 1500 may be configured to provide an active match signal HIT when a segment masked by any one of SegmentMasks(0-7) and segment information output from address decoder 342 match. The comparison circuit 1500 includes OR gates 1505, 1510 coupled to an input of NAND gates 1515, 1520, respectively, for SegmentMask6 and SegmentMask7. A first input of each OR gate 1505, 1510 may be MASK signal SegmentMask6 and SegmentMask7, respectively, and the second input of each OR gate may be fixed to a logic level high. The outputs of the NAND gates 1515, 1520 for Segments 6 and 7 may be provided to a separate NAND gate 1525. The outputs of the NAND gates for Segments 6 and 7 are coupled to the same NAND gate as Segments 4 and 5. In the embodiment illustrated in FIG. 15, Segments 6 and 7 correspond to the state where both X13 and X14 are 1. As a result, when both of the segments are selected, an active HIT signal may be output. Regardless of the signal from the MASK, because of the fixed logic level high at the second inputs of OR gates 1505, 1510 SegmentMask6 and SegmentMask7 may be respectively fixed to a high logic level during operating of the segment mask function. As described in more detail below, fixing SegmentMask6 and SegmentMask7 to a high logic level may suppress refresh operations corresponding to addresses having both X13 and X14 equal to 1. The NAND gate 1525 may be coupled through an inverter 1530 to an input of NAND gate 1535. NAND gate 1535 may also receive the output of NAND gate 1540. NAND gate 1540 may receive the combined logic outputs of Segments 0-5 and internal self-refresh signal SR. Since NAND gate 1525 is coupled to a succeeding stage of NAND gate 1540, the corresponding function may be made active not only at the time of a self-refresh operation, but also at the time of all-bank auto-refreshing or other refresh operations. This may allow other or all types of refresh operations on non-existent memory mats (e.g., memory mats corresponding to addresses having both X13 and X14 equal to 1) to be suppressed. During the corresponding address period, circuits that are operated by the internal self-refresh command (represented by the signal SR) and the refresh all bank command (represented by the signal REFADD) may be blocked and power consumption by a semiconductor memory device may be reduced.

As shown its FIG. 13, Segments 6 and 7 are masked because these segments correspond to 2K addresses where both X13 and X14 of the possible 8K addresses are set to 1. However, for configurations in which the addresses where no memory mats exist correspond to other segments, the comparison circuit 1500 may be modified to mask the corresponding segments. For example, for configurations in which the addresses where no memory mats exist correspond to Segments 5-7, these three segments may be masked. For configurations in which the addresses where no memory mats exist correspond to Segment 7, only the corresponding Segment 7 may be masked. Other configurations may also be used.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
   a memory array comprising a plurality of portions, wherein a number of the plurality of portions is not equal to an Nth power of 2;
   a refresh circuit configured to cause a refresh operation to be performed on the memory array at a memory address when a corresponding refresh address is received; and
   an address counter configured to provide a refresh address to the refresh circuit, wherein the address counter includes a plurality of counter cells coupled in series from a first counter cell to a last counter cell downstream of the first counter cell, the plurality of counter cells configured to count through count values between a minimum count value to a maximum count value, wherein an output of each of the plurality of counter cells each correspond to an address bit of the refresh address, wherein at least some of the refresh addresses have no corresponding memory addresses in the plurality of portions of the memory array,
   wherein the address bit of the refresh address provided by a later counter cell downstream of an earlier counter cell is a less significant bit of the refresh address than the address bit of the refresh address provided by the earlier counter cell such that periods of no refresh operations are distributed across a refresh period, wherein the refresh operation is performed at every memory address of the memory once during the refresh period.

2. The apparatus of claim 1, wherein a second counter cell downstream of the later counter cell provides an address bit of the refresh address that is a less significant than the address bit of the refresh address provided by the earlier counter cell.

3. The apparatus of claim 1, wherein the address bit of the refresh address provided by the later counter cell and the address bit of the refresh address provided by the earlier counter cell are consecutive bits of the refresh address.

4. The apparatus of claim 1, wherein one of the address bit of the refresh address provided by the later counter cell and the address bit of the refresh address provided by the earlier counter cell is a most significant bit of the refresh address.

5. The apparatus of claim 1, herein the address counter is a binary counter.

6. The apparatus of claim 1, wherein the refresh circuit refreshes the plurality of portions of the memory at non-consecutive memory addresses, responsive to the refresh address.

7. The apparatus of claim 1, wherein distributing the periods of no refresh operations across the refresh period increases a consistency of an average current consumption of the memory.

8. A method, comprising:
   incrementing a count value of an address counter from a minimum count value to a maximum count value, wherein the address counter comprises a plurality of counter cells coupled in series from a first counter cell to a last counter cell downstream of the first counter cell, wherein each count value corresponds to a refresh address and an output of each of the plurality of counter cells provides an address bit of the refresh address, wherein the address bit of the refresh address provided by a later counter cell downstream of an earlier counter cell is a less significant bit of the refresh address than the address bit of the refresh address provided by the earlier counter cell;
   providing the refresh address from the address counter for each count value,
   refreshing memory mat of a memory, the memory comprising a number of memory mats not equal to an Nth power of 2, at a memory address when the refresh address corresponds to the memory address, wherein at least one refresh address has no corresponding memory address, wherein every memory mat of the memory is refreshed once during a defined refresh period and periods of no refresh operation when the refresh address has no corresponding memory address are distributed over the defined refresh period due to the address bit of the refresh address provided by the later counter cell downstream of the earlier counter cell being the less significant bit of the refresh address than the address bit of the refresh address provided by the earlier counter cell.

9. The method of claim 8, wherein the address counter is configured to produce 2 to the N power refresh addresses.

* * * * *